United States Patent
Eltoukhy et al.

(10) Patent No.: US 12,360,139 B2
(45) Date of Patent: Jul. 15, 2025

(54) FAST TRANSIENT DETECTION

(71) Applicant: Google LLC, Mountain View, CA (US)

(72) Inventors: Ali Eltoukhy, Los Gatos, CA (US);
Mikhail Popovich, Danville, CA (US);
Rami Abouhamze, San Carlos, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 17/885,071

(22) Filed: Aug. 10, 2022

(65) Prior Publication Data

US 2024/0094264 A1    Mar. 21, 2024

(51) Int. Cl.
*G01R 19/00* (2006.01)
*G01R 31/26* (2020.01)
*H02J 7/00* (2006.01)

(52) U.S. Cl.
CPC ......... *G01R 19/0084* (2013.01); *G01R 31/26* (2013.01); *H02J 7/0047* (2013.01)

(58) Field of Classification Search
CPC .... G01R 19/0084; G01R 31/26; H02J 7/0047
See application file for complete search history.

(56) References Cited

U.S. PATENT DOCUMENTS

| | | | |
|---|---|---|---|
| 5,805,401 A * | 9/1998 | Schuellein | H03K 17/30 361/115 |
| 6,954,083 B1 * | 10/2005 | Thornley | G01R 31/3016 326/14 |
| 6,965,502 B2 | 11/2005 | Duffy et al. | |
| 7,138,815 B1 * | 11/2006 | Alexander | G01R 31/2853 324/762.02 |
| 7,521,913 B2 | 4/2009 | Tang et al. | |
| 7,570,036 B2 | 8/2009 | Tang et al. | |
| 7,898,236 B2 * | 3/2011 | Houston | H02M 3/1584 323/284 |
| 8,232,786 B2 | 7/2012 | Phadke et al. | |
| 10,958,170 B2 | 3/2021 | Babazadeh | |
| 11,171,562 B1 * | 11/2021 | Vilas Boas | G05F 1/575 |
| 2008/0013242 A1 | 1/2008 | Churchward | |
| 2017/0030954 A1 | 2/2017 | Whatmough et al. | |
| 2017/0052219 A1 * | 2/2017 | Knoth | G06F 11/3058 |
| 2020/0358283 A1 | 11/2020 | Cui et al. | |
| 2022/0341975 A1 * | 10/2022 | Vilas Boas | G01R 19/16576 |
| 2023/0233151 A1 * | 7/2023 | Baumann | A61B 5/1451 600/301 |

FOREIGN PATENT DOCUMENTS

WO    2018160578 A1    9/2018

OTHER PUBLICATIONS

Extended European Search Report for European Patent Application No. 23157037.5 dated Dec. 15, 2023. 9 pages.

* cited by examiner

*Primary Examiner* — Feba Pothen
(74) *Attorney, Agent, or Firm* — Lerner David LLP

(57) ABSTRACT

A voltage supervisor (VS) or voltage sensing circuitry or architecture that can detect fast voltage transients. To detect fast voltage transients, a dedicated differential pair is routed between a point of load, such as a die or other chip, processor, etc., and the circuitry of the voltage supervisor. By connecting the differential pair at the point of load, fast voltage transients may be detected at the load level (e.g., at the point of load) and thereafter used to enable, disable, and/or restart an electronic device, such as a die, chip, processor, or other electronic component or system.

20 Claims, 5 Drawing Sheets

FAST TRANSIENT DETECTION

BACKGROUND

Many modern electronic devices, including electronic systems and individual electronic components, have strict power supply operating ranges. These electronic devices may be damaged, fail, and/or suffer from performance reductions when supplied with power outside of the appropriate operating ranges. Certain electronic devices may fail to power on if the power being supplied is outside of an appropriate operating range.

Voltage supervisors sometimes referred to as reset integrated circuits, brownout detectors, or voltage detectors, are devices that can monitor and control the power being delivered to electronic devices. Voltage supervisors may detect voltage transients, which are either under-voltage or over-voltage events. Under-voltage events are when voltage droops or falls below a certain threshold and over-voltage events are when voltage surges above a certain threshold. When a voltage supervisor detects a voltage transient event, the voltage supervisor may assert a signal to enable, disable, or reset another device, such as an electronic device. By doing so, a voltage supervisor may prevent performance issues or failures of electronic devices.

Typical voltage supervisors are only capable of detecting voltage transient events that are longer than 100 ns. However, fast transient events, such as those that last less than 100 ns and are undetected by a voltage supervisor, can still damage and negatively affect the performance of electronic devices.

BRIEF SUMMARY

The present disclosure provides a voltage supervisor capable of detecting and responding to fast voltage transient events. One aspect of the disclosure is directed to an apparatus, comprising: voltage monitoring circuitry for sensing voltage changes and having a first connection point and a second connection point; and a pair of leads connected to a die and coupled to the first connection point and the second connection point to enable the voltage monitoring circuitry to sense a differential voltage associated with an effective power supply voltage at the die.

In some instances, the differential voltage comprises a voltage change having a duration less than or equal to 10 nanoseconds.

In some instances, the differential voltage comprises a voltage change having a duration less than or equal to 1 nanosecond.

In some instances, the pair of leads are connected to the die across a resistor and a capacitor connected in series.

In some instances, the pair of leads are directly connected to the die.

In some instances, the pair of leads couple a change in the current load across the die to the first connection point and the second connection point.

In some instances, the voltage monitoring circuitry comprises a voltage supervisor.

In some instances, the voltage monitoring circuitry is configured to include a threshold voltage that is adjustable in increments of 5 millivolts or less.

In some instances, the voltage monitoring circuitry comprises a reset output that outputs a reset signal based on the differential voltage sensed by the voltage monitoring circuitry.

In some instances, the apparatus comprises one of a printed circuit board, integrated circuit packaging, or a system on a chip.

In some instances, the voltage monitoring circuitry comprises a voltage supervisor comprising a voltage monitor.

In some instances, the voltage supervisor further comprises a voltage regulator configured to provide power to the die.

In some instances, the voltage monitor is configured to sense the differential voltage associated with the effective power supply voltage at the die and pass the differential voltage to the voltage regulator.

In some instances, the voltage regulator compares the differential voltage to a reference voltage to determine a voltage change.

In some instances, the regulator is configured to assert a signal to the die to enable, disable, or reset the die.

In some instances, the voltage supervisor is part of the die.

In some instances, the voltage monitor is configured to sense a differential voltage associated with an effective power supply voltage at a PCB on which the die is mounted.

In some instances, the voltage monitor is configured to pass the differential voltage associated with an effective power supply voltage at the PCB to the voltage regulator.

In some instances, the voltage regulator compares the differential voltage associated with an effective power supply voltage at the PCB to the reference voltage to determine a voltage change.

In some instances, the regulator is configured to, after determining the voltage change satisfies a threshold value, assert a signal to the die to enable, disable, or reset the die.

DETAILED DESCRIPTION

The present disclosure provides a voltage supervisor (VS) or voltage sensing circuitry or architecture that can detect fast voltage transients. To detect fast voltage transients, a dedicated differential pair is routed between a point of load, such as a die or other chip, processor, etc., and the circuitry of the voltage supervisor. By connecting the differential pair at the point of load, fast voltage transients may be detected at the load level (e.g., at the point of load) and thereafter used, for example, to enable, disable, and/or restart an electronic device, such as a die, chip, processor, or other electronic component or system.

Figure 1:
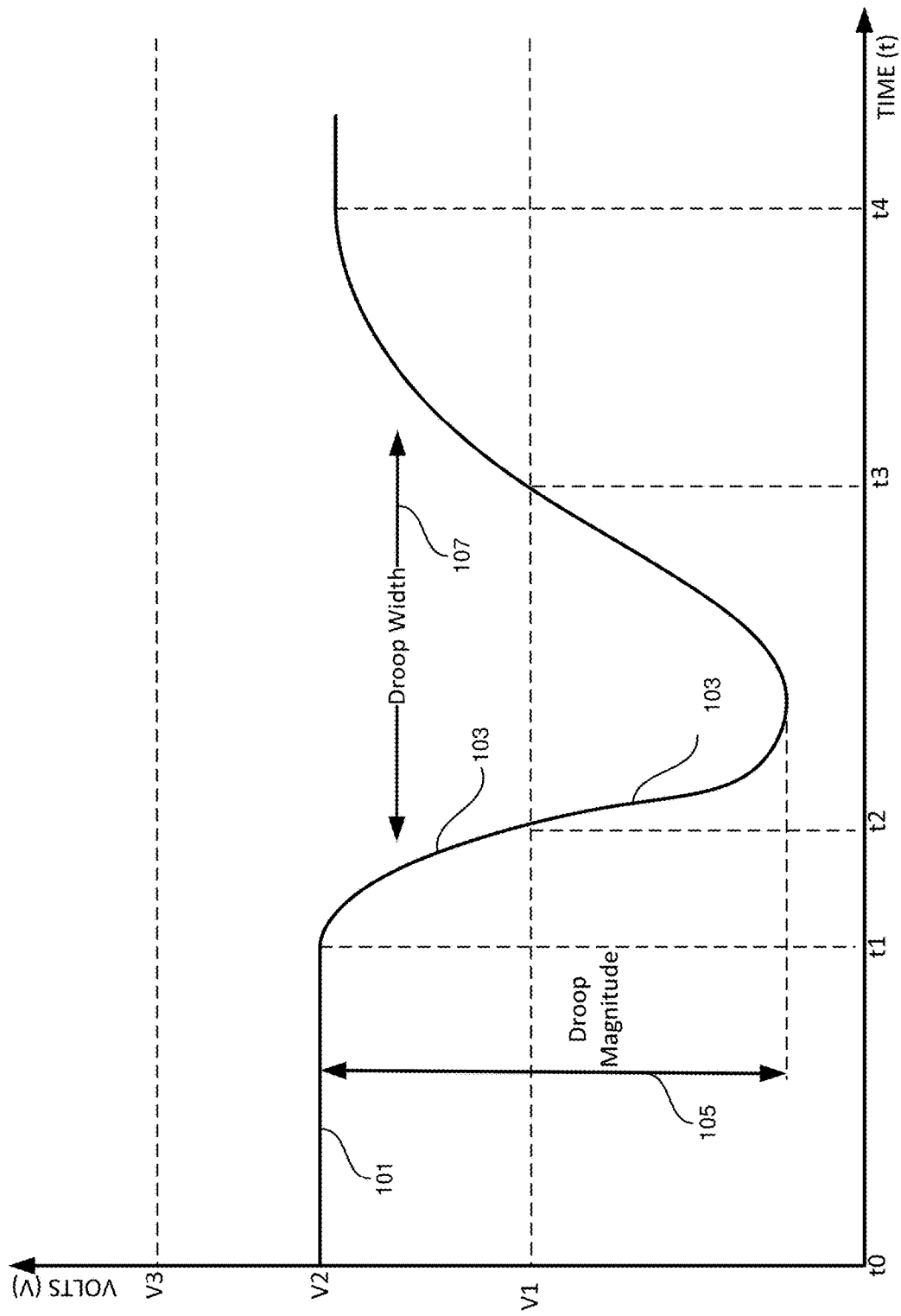
FIG. 1 is a block diagram of an example droop in a power signal in accordance with aspects of the present disclosure.

FIG. 1 illustrates a sample transient event triggered by a droop 103 (i.e., drop in voltage.) FIG. 1 shows the voltage level of a power signal 101 being delivered to an electronic device over a period of time t. Prior to time t1, the voltage of power signal 101 is V2. However, at time t1, the voltage of power signal 101 begins to droop, and at time t2, the voltage of power signal 101 may fall below a threshold voltage, illustrated as V1. Upon crossing the threshold value V1, a transient event may be considered to have occurred. At time t3, when the voltage of power signal 101 goes above the threshold value V1, the transient event may be considered to have ended. The voltage of power signal 101 returns to V2 at time t4. A droop may be defined by its width, illustrated by line 107, and its "magnitude" (i.e., the maximum reduction in voltage value of the signal over the droop width.)

A transient event may also occur when a power signal, such as power signal 101, surges above a threshold voltage. For instance, and as further illustrated in FIG. 1, if the power signal 101 crosses above an upper threshold voltage, illustrated as V3, a transient event may be considered to have occurred. Thus, transient events may result from both power surges and power droops.

As used herein, a fast transient event may be considered a transient event when the voltage of the power signal 101 stays below a threshold value for less than 100 ns. Continuing the example shown in FIG. 1, the determination of whether the transient event is a fast transient event may be determined by subtracting time t2 from t3. If the resulting value is less than 100 ns, the illustrated transient event resulting from the droop may be considered a fast transient event. Similarly, if the power signal 101 stays above upper threshold voltage V3 for less than 100 ns (i.e., crosses above and then below V3 in less than 100 ns), the transient event resulting from the surge may be considered a fast transient event.

Figure 2:
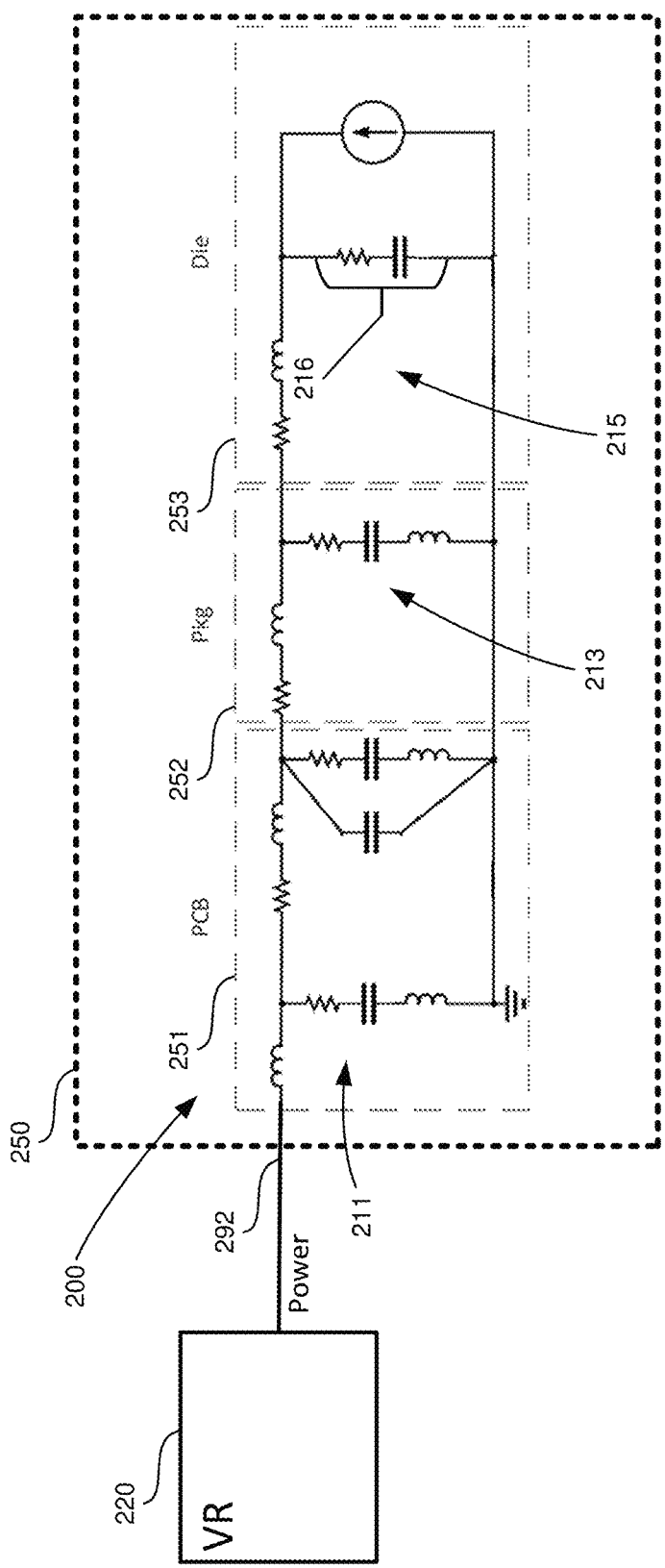
FIG. 2 is a block diagram of an example voltage regulator providing power to an integrated circuit in accordance with aspects of the present disclosure.

FIG. 2 illustrates a typical VR 220 connected to an integrated circuit (IC) 250 via a power delivery network 200 (PDN). The IC 250 includes a printed circuit board (PCB) 251, packaging (Pkg) 252, and a die 253. The PDN 200 includes circuitry 211 within the PCB 251, circuitry 213 within Pkg 252, and circuitry 215 within die 253. The circuitry illustrated by 211, 213, and 215 are merely examples meant to represent RLC networks typically present in PCBs, Pkgs, and dies, respectively. More or fewer components in the same or different configurations than illustrated in circuitry 211, 213, and 215 may be present. Although the IC 250 is shown as including a single PCB 251, Pkg 252, and die 253, the IC 250 may include any number of dies, packages, PCBs, and other components (e.g., transistor, resistors, capacitors, inductors, chips, processors, etc.) and circuitry found in an integrated circuit. Further, although an IC 250 is illustrated, a VR 220 may be connected to a printed circuit board and/or a system on a chip.

As further shown in FIG. 2, the VR 220 may be connected to the PDN 200 via power line 292. Although not illustrated, the VR 220 may include or be connected to one or more transistors, such as field effect transistors (FETs) or metal oxide semiconductor FETS (MOSFETs), for controlling the voltage output by the VR 220, such as by increasing or decreasing the output voltage to maintain a consistent output voltage. Although the VR 220 is shown as being outside of IC 250, in some implementations the VR 220 may be within the IC. In such implementation, the PDN 200 may also be entirely within the IC 250.

The PDN 200 may carry a power signal from the VR 220 to a point of load 216 in the die 205 via power line 292. As the power signal is carried on the PDN to the point of load 216, the RLC components, or combinations thereof, within the circuitry 211, 213, and 215 may act as high-frequency filters that may filter out high-frequency transients at the PCB or packaging level. Moreover, the RLC components may cause a current drop (IR drop) due to the resistance (R) the current (I) of the power signal encounters from the RLC components and other such circuitry as it travels the PDN 200 to the PoL 216. As used herein, unless otherwise stated, resistance (R) is not limited to the resistance of a resistor, but instead refers to the resistance that current faces as it travels through a PDN, such as PDN 200.

IR drop may lead to a loss of efficiency in delivering power. In this regard, the current drops may be dissipated (e.g. in the form of heat loss) instead of being provided to the intended destination (e.g., the PoL.) Thus, power delivery is less efficient which may increase operating costs, waste money, etc.

The IR drop introduced by RLC components in the PCB 251, Pkg 252, and/or die 253 may also make the detection of transient events by a voltage supervisor slower, as the transient event has to propagate through the PCB and circuitry connecting the PCB to the voltage supervisor before getting detected. In this regard, voltage supervisors typically monitor for voltage transients at the PCB level and are connected to the PDN 200 through the PCB. Thus, the transient event may hit the PoL 216 before the transient event has propagated to the voltage supervisor and/or before the voltage supervisor has time to act on a detected transient event. Moreover, IR drops that occur after the PCB 251, such as in the Pkg 252 and/or die 253 may go undetected.

As described herein, the VS of the disclosed technology addresses filtering by implementing differential remote voltage sensing at or close to the point of load. By detecting the differential remote voltage at the point of load, the effects of fast transient filtering that occurs when detection occurs at the PCB or packaging level may be reduced or eliminated. In addition, by routing a differential pair of leads from the die or other point-of-load (POL) to the VS, the VS is enabled to allow for adjustment of VR voltage trigger levels in smaller increments. Further, the technology enables the monitoring of multiple power rails on a PCB or within the packaging or die.

Another aspect of the disclosed technology is sensing the effective power supply voltage as close to the point of load as possible or directly from the POL if possible. In this regard, the VS may be integrated into the die or other such component to minimize the propagation of time of the transient to the VS. This aspect will compensate for most of the current drop (IR drop) occurring at the PCB, packaging, and possibly on the die.

The technology described herein also advantageously allows for a VS to detect droops that result in a transient event, including fast transient events. Detecting droops may enable a VS to monitor the voltage rails within a system (e.g., PCB, package, etc.) to detect such droops and send an alert that may be used to reset the system, processor, etc. As previously explained, the failure to generate an alert when fast transients occur may cause a system to experience performance issues such as a brownout (e.g., resulting in operation at a lower speed than intended), a failure (e.g., operating differently than intended, or totally shut down), or be damaged. This technology mitigates or prevents these types of events.

Figure 3:
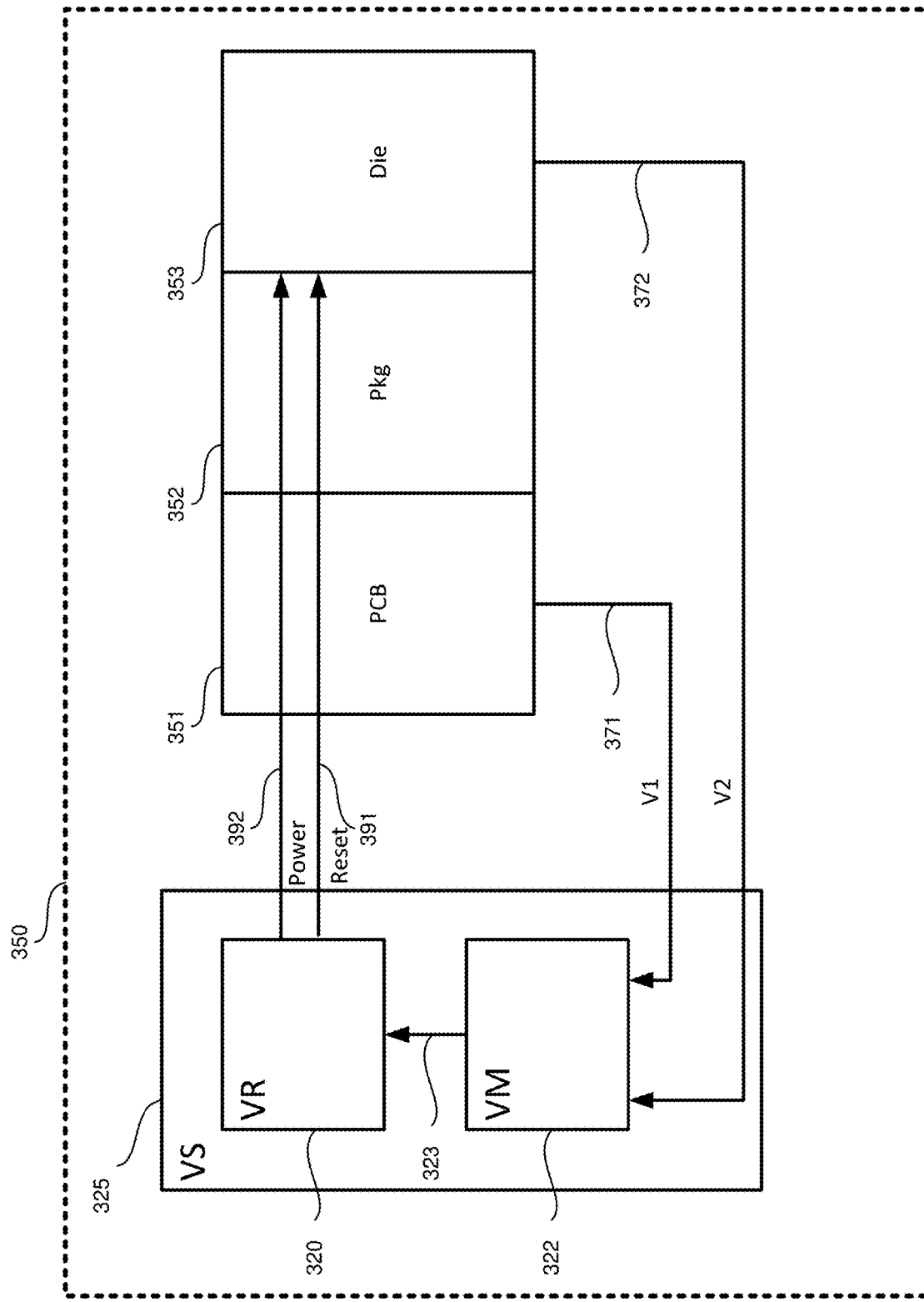
FIG. 3 is a block diagram of an example voltage supervisor and integrated circuit in accordance with aspects of the present disclosure.

FIG. 3 illustrates an example voltage supervisor 325 including a VR 320 and VM 322 within an integrated circuit 350. Although the VS 325 is shown as being separate from the other illustrated components of the IC including PCB 351, Pkg 352, and die 353, the VS may be integrated into such components. For instance, VS 320 may be mounted to the PCB 351 or integrated into the die 353. Although IC 350 is shown as including a single PCB 351, Pkg 352, and die 353, the IC 250 may include any number of dies, packages, PCBs, and other components (e.g., transistor, resistors, capacitors, inductors, chips, processors, etc.) and circuitry found in an integrated circuit. By positioning the VS 325 within the IC 350, the propagation delays experienced by typical voltage supervisors is avoided.

Although FIG. 3 illustrates an example VS 325 including VR 320. However, in some examples, VR 320 may be a separate component from the VS 325. In such cases, the VR 320 may be connected to the VM 322 via an external connection between the VS 325 and VR 320

In operation, the VR 320, which may be compared to VR 220, delivers power to a point of load (not shown) in die 353. The VM 322 detects voltage changes in the power being delivered by the VR 320 to the PoL relative to a reference power. Based on these detected differences, which the VM 322 may provide to the VR, the VR may adjust (i.e., increase or decrease) the amount of voltage being provided to the PoL. In the event the power being provided to the PoL moves outside of a predetermined operating range, such as due to a transient event (including fast transient events), the VS 325, such as through the VR 320, may assert a signal on reset line 391 to enable, disable, or reset the die 353. In other instances, the VM 322 or other componentry of the VS 325 may assert the signal to enable, disable, or reset the die 353. In these examples, the reset line 391 may run from the VM 322 or other componentry of the VS 325.

As illustrated, the VR 320 provides power via a power line 392 to other components of integrated circuit 350, including any components within the PCB 351, Pkg, 352, and die 353, which may be compared to PCB 251, Pkg 252, and die 253, respectively. Although not shown, the VR 320 may provide power to any number of components in the integrated circuit 350, including components on the PCB 351, Pkg 352, and die 353.

As illustrated in FIG. 3, the VM 322 is configured to receive differential voltage measurements taken at the PCB 351 and die 353. In this regard, a differential voltage measurement V1 taken at PCB 351 is provided to VM 322 through a connection, represented by line 371. Similarly, a differential voltage measurement V2 taken at die 353 is provided to VM 322 through a connection, represented by line 372. Although FIG. 3 illustrates differential voltage measurement V1 being captured at PCB 351, V1 may be captured at Pkg 352 or before PCB 351. In some embodiments, a third differential voltage measurement may be captured at Pkg 352, in which case three differential voltage measurements may be provided to the VM 322.

Figure 4:
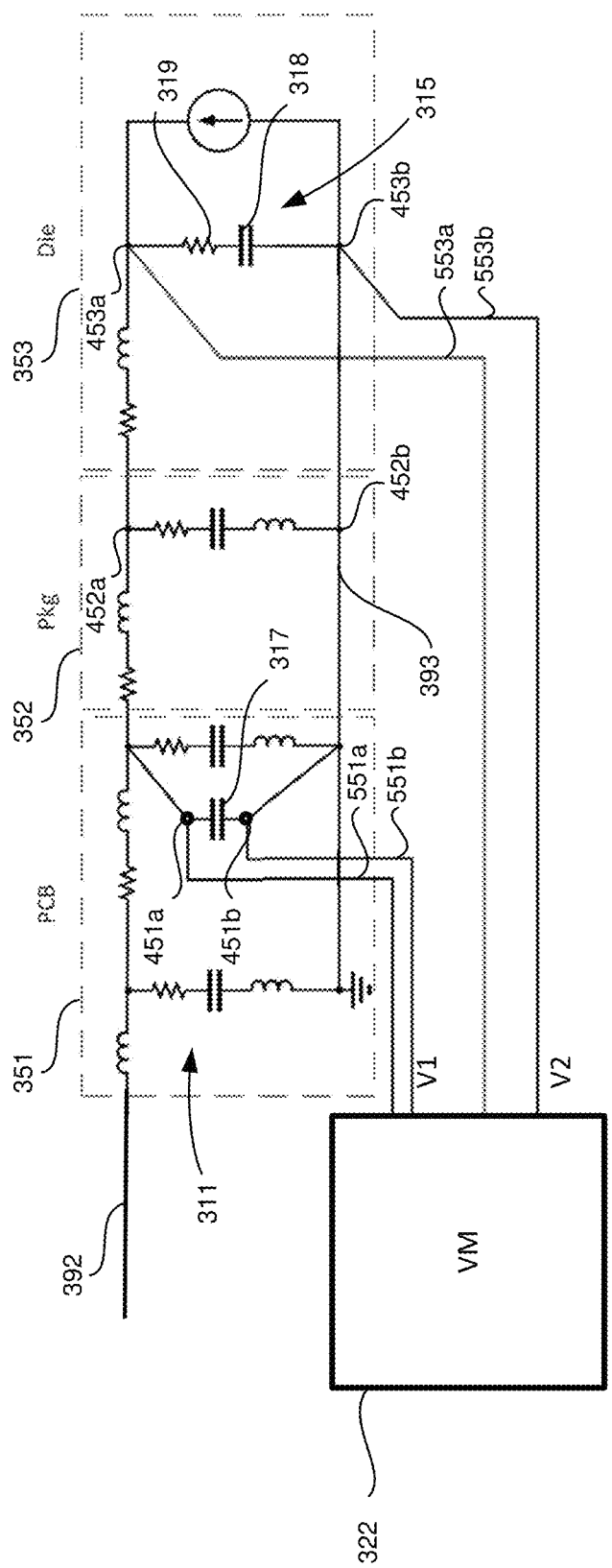
FIG. 4 is a block diagram of an example voltage monitor monitoring power within the integrated circuit in accordance with aspects of the present disclosure.

FIG. 4 shows example connection points for capturing differential voltage measurements V1 and V2 in PCB 351 and die 353, respectively. In this regard, differential voltage measurement V1 may be captured at connection points 451a and 451b across capacitor 317 in PCB circuitry 311. Similarly, differential voltage measurement V2 may be captured at connections points 453a and 453b, across capacitor 318 and resistor 319, which are connected in series, in die circuitry 315. Differential voltage measurement V2 is the differential voltage measurement across the point of load within die 353. The connection points illustrated in FIG. 4 are merely examples. Any connection points which capture the voltage on a power line, such as power line 392, and a ground line, such as ground line 393 may be used to measure a differential voltage.

The measurements corresponding to V1 and V2 may be passed back to the voltage monitor 322 via connections. For instance, the measurements associated with voltage measurement V1 captured at points 451a and 451b may be passed to VM 322 via lines 551a and 551b, respectively. Likewise, the measurements associated with voltage measurement V1 captured at points 453a and 453b may be passed to VM 322 via lines 553a and 553b, respectively.

Figure 5:
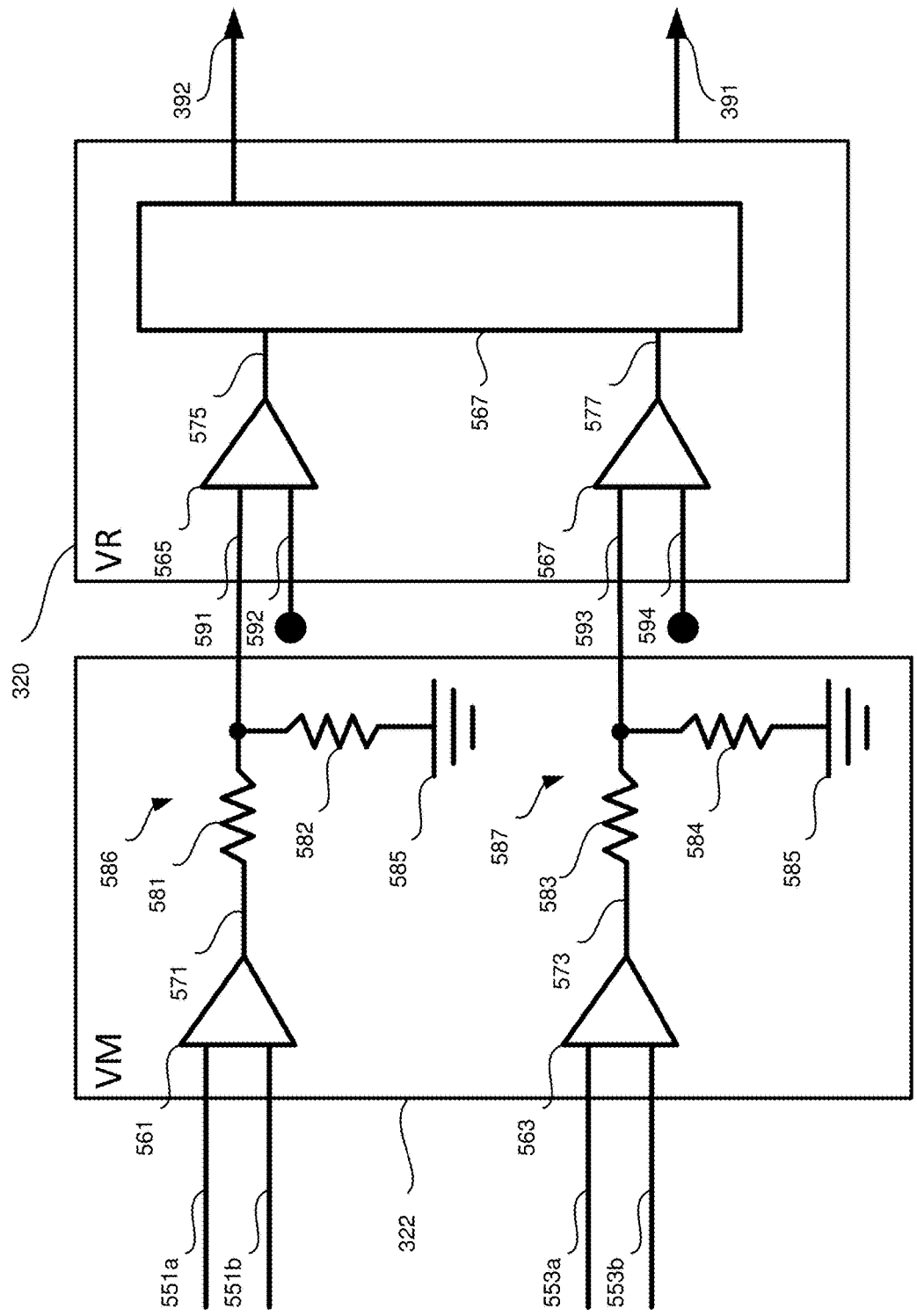
FIG. 5 is a block diagram of the components of a voltage monitor and voltage regulator in accordance with aspects of the present disclosure.

FIG. 5 illustrates the connections of the differential voltage measurements to differential amplifiers within the VM 322. In this regard, lines 551a and 551b are connected to differential amplifier (DA) 561, and lines 553a and 553b are connected to DA 563. The differential amplifiers 561 and 563 convert the differential voltage measurements into a single-ended ground reference signal. The differential voltage measurement is the difference between the voltages on the lines input into the DAs. For example, DA 561 may determine the differential voltage between the voltage on lines 551a and 551b, which corresponds to the voltage at PCB 351. Likewise, DA 563 determines the differential voltage between the voltage on lines 553a and 553b, which corresponds to the voltage at die 353.

The differential voltages output by DAs 561 and 563 may be boosted or attenuated according to a gain introduced by the DAs. In this regard, the DAs 561 and 563 may supply a gain value to the differential voltages before they are output on lines 571 and 573, respectively.

The differential voltages output from DAs 561 and 563 on lines 571 and 573, respectively, may be input into a voltage divider formed by pairs of resistors. For instance, line 571 carrying the differential voltage from DA 561 may be input into voltage divider 586 formed by resistors 581 and 582, connected in parallel, with resistor 582 being connected to ground 585. Likewise, line 537 may be input into voltage divider 586 formed by resistors 583 and 584, connected in parallel, within resistor 584 being connected to ground 585. The voltage dividers 586 and 587 may attenuate the differential voltages values based on the resistor values used. In some instances, the VM 322 may not include voltage dividers.

Referring back to FIG. 3, the VM 322 may be connected to VR 320 via a connection illustrated as line 323. The VM 322 may pass the differential voltages to the VR 320 via this connection. For instance, and as illustrated in FIG. 5, the differential voltage from DA 561 may be passed, via line 591, to an input on operational amplifier 565. Similarly, the differential voltage from DA 563 may be passed, via line 593 to an input to on operational amplifier 567.

Each operational amplifier 565 and 567 may compare the respective differential voltages they receive to a reference voltage received via lines 592 and 594, respectively. The reference voltage is a predefined value against which the differential voltages are compared. The threshold voltage may be adjustable in increments of 5 millivolts or more or less. If a differential voltage goes below the predefined value, a transient event may have occurred. In some instances, a transient event may be determined to have occurred when a differential voltage goes above a reference voltage The output from the operational amplifiers may be sent to other circuitry or a process, as illustrated by block 567, via lines 575 and 577. The other circuitry or processor 567 may determine, based on the outputs of the operational amplifiers whether to assert a signal on reset line 391 to enable, disable, or reset the die 353.

Although the technology herein has been described with reference to particular embodiments, it is to be understood that these embodiments are merely illustrative of the principles and applications of the present technology. It is therefore to be understood that numerous modifications may be made to the illustrative embodiments and that other arrangements may be devised without departing from the spirit and scope of the present technology as defined by the appended claims.

Most of the foregoing alternative examples are not mutually exclusive, but may be implemented in various combinations to achieve unique advantages. As these and other variations and combinations of the features discussed above can be utilized without departing from the subject matter defined by the claims, the foregoing description of the embodiments should be taken by way of illustration rather than by way of limitation of the subject matter defined by the claims. As an example, the preceding operations do not have to be performed in the precise order described above. Rather, various steps can be handled in a different order, such as reversed, or simultaneously. Steps can also be omitted unless otherwise stated. In addition, the provision of the examples described herein, as well as clauses phrased as "such as," "including" and the like, should not be interpreted as limiting the subject matter of the claims to the specific examples; rather, the examples are intended to illustrate only one of many possible embodiments. Further, the same reference numbers in different drawings can identify the same or similar elements.

The invention claimed is:

1. An apparatus, comprising:
voltage monitoring circuitry for sensing voltage changes and having a first connection point and a second connection point; and
a pair of leads connected to a die at points internal to the die such that the pair of leads is connected across a load at a point of load, and coupled to the first connection point and the second connection point to enable the voltage monitoring circuitry to sense a differential voltage associated with an effective power supply voltage at the point of load, wherein the differential voltage comprises a voltage change having a duration less than 100 nanoseconds, and wherein the duration is a continuous period of time that the differential voltage is below a lower threshold voltage, or a continuous period of time that the differential voltage is above an upper threshold voltage.

2. The apparatus of claim 1, wherein the duration is less than or equal to 10 nanoseconds.

3. The apparatus of claim 1, wherein the duration is less than or equal to 1 nanosecond.

4. The apparatus of claim 1, wherein the pair of leads are connected to the die across a resistor and a capacitor connected in series.

5. The apparatus of claim 4, wherein the pair of leads are directly connected to the die.

6. The apparatus of claim 4, wherein the pair of leads couple a change in the current load across the die to the first connection point and the second connection point.

7. The apparatus of claim 1, wherein the voltage monitoring circuitry comprises a voltage supervisor.

8. The apparatus of claim 1, wherein the lower threshold voltage or upper threshold voltage is adjustable in increments of 5 millivolts or less.

9. The apparatus of claim 1, comprising a reset output that outputs a reset signal based on the differential voltage sensed by the voltage monitoring circuitry.

10. The apparatus of claim 1, wherein the apparatus comprises one of a printed circuit board, integrated circuit packaging, or a system on a chip.

11. The apparatus of claim 1, wherein the voltage monitoring circuitry comprises a voltage supervisor comprising a voltage monitor.

12. The apparatus of claim 11, wherein the voltage supervisor further comprises a voltage regulator configured to provide power to the die.

13. The apparatus of claim 12, wherein the voltage monitor is configured to sense the differential voltage associated with the effective power supply voltage at the die and pass the differential voltage to the voltage regulator.

14. The apparatus of claim 13, wherein the voltage regulator compares the differential voltage to the lower threshold voltage or the upper threshold voltage to determine the voltage change.

15. The apparatus of claim 14, wherein the regulator is configured to assert a signal to the die to enable, disable, or reset the die.

16. The apparatus of claim 12, wherein the voltage supervisor is part of the die.

17. The apparatus of claim 12, wherein the voltage monitor is configured to sense the differential voltage as associated with an effective power supply voltage at a PCB on which the die is mounted.

18. The apparatus of claim 17, wherein the voltage monitor is configured to pass the differential voltage associated with an effective power supply voltage at the PCB to the voltage regulator.

19. The apparatus of claim 17, wherein the voltage regulator compares the differential voltage as associated with an effective power supply voltage at the PCB to the lower threshold voltage or the upper threshold voltage to determine the voltage change.

20. The apparatus of claim 19, wherein the regulator is configured to, after determining the voltage change satisfies a threshold value, assert a signal to the die to enable, disable, or reset the die.

* * * * *